(12) United States Patent
Streck et al.

(10) Patent No.: US 8,105,943 B2
(45) Date of Patent: Jan. 31, 2012

(54) ENHANCING STRUCTURAL INTEGRITY AND DEFINING CRITICAL DIMENSIONS OF METALLIZATION SYSTEMS OF SEMICONDUCTOR DEVICES BY USING ALD TECHNIQUES

(75) Inventors: Christof Streck, Coswig (DE); Volker Kahlert, Dresden (DE); John A. Iacoponi, Wappingers Falls, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 188 days.

(21) Appl. No.: 12/472,824

(22) Filed: May 27, 2009

(65) Prior Publication Data

US 2010/0025855 A1 Feb. 4, 2010

(30) Foreign Application Priority Data

Jul. 31, 2008 (DE) .................. 10 2008 035 815

(51) Int. Cl.
H01L 23/522 (2006.01)
H01L 21/768 (2006.01)
(52) U.S. Cl. .................. 438/653; 438/637; 438/702
(58) Field of Classification Search .................. 257/773, 257/774, E23.142, E21.585; 438/620, 637, 438/639, 640, 641, 644, 645, 700, 701, 702, 438/703, 704, 705, 706
See application file for complete search history.

(56) References Cited

U.S. PATENT DOCUMENTS

| 6,677,251 | B1 * | 1/2004 | Lu et al. ......................... 438/778 |
| 6,825,120 | B1 | 11/2004 | Liu et al. ........................ 438/693 |
| 7,446,058 | B2 * | 11/2008 | Yang et al. ..................... 438/781 |
| 7,629,224 | B1 * | 12/2009 | van den Hoek et al. ...... 438/409 |
| 7,750,479 | B2 * | 7/2010 | Purushothaman et al. ... 257/774 |
| 2004/0121616 | A1 | 6/2004 | Satta et al. ..................... 438/778 |
| 2008/0032064 | A1 | 2/2008 | Gordon et al. ................ 427/578 |

FOREIGN PATENT DOCUMENTS

| DE | 112004001530 T5 | 7/2006 |
| DE | 102005057061 B3 | 6/2007 |
| DE | 102006056624 A1 | 6/2008 |
| DE | 112007000177 T5 | 10/2008 |
| EP | 1 369 913 A2 | 12/2003 |

OTHER PUBLICATIONS

Translation of Official Communication from German Patent Office for German Patent Application No. 10 2008 035 815.0 dated May 7, 2009.

* cited by examiner

Primary Examiner — Roy Potter
(74) Attorney, Agent, or Firm — Williams, Morgan & Amerson, P.C.

(57) ABSTRACT

During the patterning of sophisticated metallization systems, a damaged surface portion of a sensitive low-k dielectric material may be efficiently replaced by a well-controlled dielectric material, thereby enabling an adaptation of the material characteristics and/or the layer thickness of the replacement material. Thus, established lithography and etch techniques may be used in combination with reduced critical dimensions and dielectric materials of even further reduced permittivity.

20 Claims, 6 Drawing Sheets

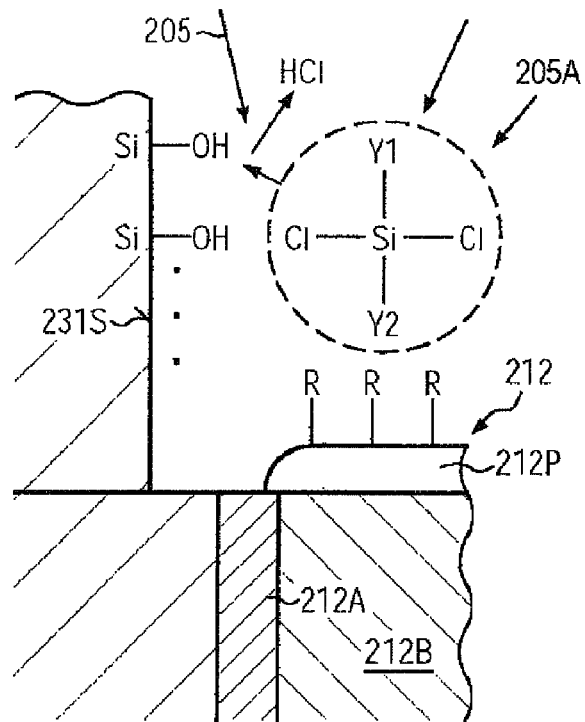
FIG. 2e
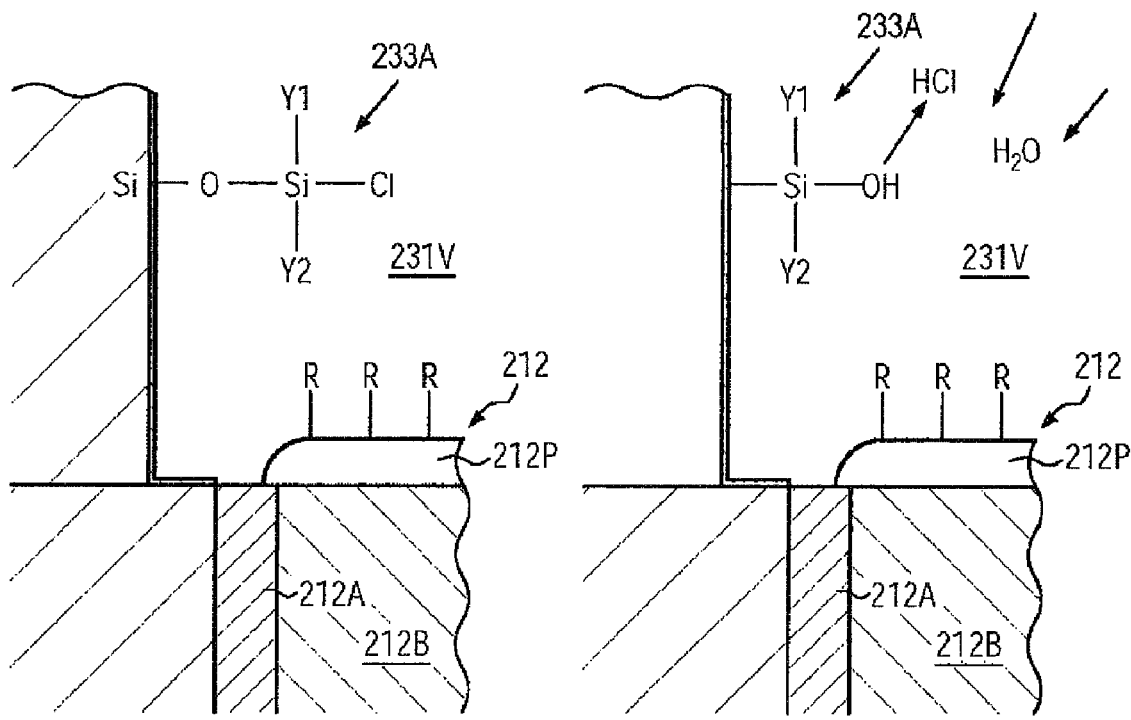
FIG. 2f
FIG. 2g

ENHANCING STRUCTURAL INTEGRITY AND DEFINING CRITICAL DIMENSIONS OF METALLIZATION SYSTEMS OF SEMICONDUCTOR DEVICES BY USING ALD TECHNIQUES

BACKGROUND OF THE INVENTION

1. Field of the Invention

The present disclosure generally relates to the field of fabricating semiconductor devices, and, more particularly, to metallization systems including low-k dielectric materials.

2. Description of the Related Art

Today's global market forces manufacturers of mass products to offer high quality products at a low price. It is thus important to improve yield and process efficiency to minimize production costs. This holds especially true in the field of semiconductor fabrication, since here it is essential to combine cutting-edge technology with volume production techniques. One important aspect in realizing the above strategy is seen in continuously improving device quality with respect to performance and reliability, while also enhancing the diversity of functions of semiconductor devices. These advances are typically associated with a reduction of the dimensions of the individual circuit elements, such as transistors and the like. Due to the continuous shrinkage of critical feature sizes, at least in some stages of the overall manufacturing process, frequently new materials may have to be introduced to adapt device characteristics to the reduced feature sizes. One prominent example in this respect is the fabrication of sophisticated metallization systems of semiconductor devices in which advanced metal materials, such as copper, copper alloys and the like, are used in combination with low-k dielectric materials, which are to be understood as dielectric materials having a dielectric constant of approximately 3.0 and significantly less, in which case these materials may also be referred to as ultra low-k (ULK) dielectrics. By using highly conductive metals, such as copper, the reduced cross-sectional area of metal lines and vias may at least be partially compensated for by the increased conductivity of copper compared to, for instance, aluminum, which has been the metal of choice over the last decades, even for sophisticated integrated devices.

On the other hand, the introduction of copper into semiconductor manufacturing strategies may be associated with a plurality of problems, such as sensitivity of exposed copper surfaces with respect to reactive components, such as oxygen, fluorine and the like, the increased diffusion activity of copper in a plurality of materials typically used in semiconductor devices, such as silicon, silicon dioxide, a plurality of low-k dielectric materials and the like, copper's characteristic of generating substantially no volatile byproducts on the basis of typically used plasma enhanced etch processes, and the like. For these reasons, sophisticated inlaid or damascene process techniques have been developed in which typically the dielectric material may have to be patterned first in order to create trenches and via openings, which may then be coated by an appropriate barrier material followed by the deposition of the copper material. Consequently, a plurality of highly complex processes, such as the deposition of sophisticated material stacks for forming the interlayer dielectric material including low-k dielectrics, patterning the dielectric material, providing appropriate barrier and seed materials, filling in the copper material, removing any excess material and the like, may be required for forming sophisticated metallization systems, wherein the mutual interactions of these processes may be difficult to assess, in particular as material compositions and process strategies may frequently change in view of further enhancing overall performance of the semiconductor devices.

For example, the continuous shrinkage of the critical dimensions may also require reduced dimensions of metal lines and vias formed in the metallization system of sophisticated semiconductor devices which may lead to closely spaced metal lines, which in turn may result in increased RC (resistive capacitive) time constants. These parasitic RC time constants may result in significant signal propagation delay, thereby limiting overall performance of the semiconductor device, although highly scaled transistor elements may be used in the device level. For this reason, the parasitic RC time constants may be reduced by using highly conductive metals, such as copper, in combination with dielectric materials of very reduced permittivity, also referred to as ULK materials, as previously discussed. On the other hand, these materials may exhibit significant reduced mechanical and chemical stability, for instance when exposed to the various reactive etch atmospheres, for instance during etch processes, resist removal and the like, thereby increasingly creating a damage zone at the exposed surface portions of these sensitive dielectric materials. The damaged surface portions, however, may result in reduced reliability of the overall metallization system, that is, a premature device failure may occur during operation of the device and/or subsequent process steps may be significantly affected by the damaged surface portions, thereby also contributing to a reduced overall performance and reliability. For these reasons, the damaged surface portions may be removed prior to subsequent process steps, which may also be associated with certain negative effects on the finally obtained semiconductor device, as will be described in more detail with reference to FIGS. 1a-1b.

FIG. 1a schematically illustrates a cross-sectional view of a semiconductor device 100 at a manufacturing stage in which a metallization system is to be formed on the basis of sensitive dielectric materials in combination with highly conductive metals. As illustrated, the semiconductor device 100 comprises a substrate 101 above which may be formed a plurality of device levels, i.e., various levels in which circuit elements and other device features may be formed. For example, the substrate 101 may have incorporated therein an appropriate semiconductor layer in and above which circuit elements, such as transistors and the like, may be formed in accordance with design rules. Furthermore, any appropriate contact structures connecting to the circuit elements may be provided which for convenience are not shown in FIG. 1a. Furthermore, a metallization system 120 may comprise a plurality of metallization layers of which a metallization layer 110 and an adjacent metallization layer 130 are illustrated in FIG. 1a. For example, the metallization layer 110 may comprise any appropriate dielectric material 111, such as a low-k dielectric material, the dielectric constant of which may be 3.0 or significantly less, when the ULK material is used. It should also be appreciated that the dielectric material 111 may comprise different material compositions, depending on the overall device requirements. Furthermore, a plurality of metal lines 112 may be formed in the dielectric material 111 and may represent respective metal lines or any other metal regions as are required according to the overall circuit layout of the device 100. The metal lines 112 may comprise a conductive barrier material 112A, which may act as an interface between a highly conductive metal 112B, such as copper, copper alloy and the like, and the dielectric material 111. Thus the conductive barrier material 112A may suppress any diffusion of reactive components, such as oxygen, fluorine and the like, to the copper-based metal 112B in order to suppress any unwanted chemical reaction, while on the other hand out-diffusion of copper atoms into the surrounding dielectric material 111 may also be suppressed by the barrier material 112A. For example, tantalum nitride, tantalum and the like are well-established barrier materials used to provide the desired chemical and mechanical integrity of the copper-based metal 112B.

Furthermore, dielectric layers 113 and 114 may be formed above the dielectric material 111 to act as an interface for providing the required chemical and mechanical characteristics. For example, the layer 113 may act as an efficient etch stop layer and may also provide a desired confinement of the metal 112B in the metal lines 112. For example, silicon nitride may frequently be used wherein, however, in highly advanced applications, a moderately high dielectric constant of silicon nitride materials may be considered as inappropriate and therefore silicon carbide-based materials may be used or any other dielectric materials providing a reduced dielectric constant while nevertheless having the desired characteristics with respect to metal confinement and/or etch stop capabilities may be used. Similarly, the layer 114 may act as an appropriate base material so as to form thereon a sensitive low-k dielectric material, such as a ULK material 131 of the metallization layer 130. Furthermore, the metallization layer 130 may comprise a plurality of openings in accordance with the overall device requirements. For example, trench openings 131T may be formed in an upper portion of the dielectric material 131, while a via opening 131V may be provided to connect the trenches 131T to one of the metal lines 112 in the metallization layer 110 at any appropriate position. As previously explained, in particular, the via openings 131V may have to be formed in accordance with tightly set process tolerances and may typically represent the features having the critical dimensions of the corresponding metallization level, since the via openings 131V may have to be aligned to the metal lines 112, which may also be formed on the basis of tightly set lateral dimensions.

Typically, the semiconductor device 100 may be formed on the basis of wellestablished process techniques which may include the formation of any circuit elements in the device level (not shown) followed by an appropriate manufacturing sequence for providing a contact structure. Thereafter, the metallization system 120 may be formed by depositing an appropriate dielectric material, such as the layers 113, 114, depending on the material characteristics of the lower lying device level. It should be appreciated that the metallization layer 110 may be formed in accordance with substantially the same process techniques as will be described with respect to the metallization layer 130. Hence, a respective explanation will be omitted here. Thus, after forming the metallization layer 110, the dielectric material 131 may be deposited, for instance in the form of a silicon-containing material, which may exhibit the desired low dielectric constant, as previously explained. For this purpose, a plurality of well-established chemical vapor deposition (CVD) techniques are available. Thereafter, a complex patterning sequence may be performed, for instance including the deposition of any anti-reflective coating (ARC) materials in combination with resist materials to provide an appropriate etch mask, for instance, for first defining the via openings 131V. The corresponding patterning sequence may represent a critical process sequence, since the lithography as well as the subsequent etch patterning strategies may be designed to provide the smallest feature sizes that may consistently be achieved so that any further reduction of the lateral dimensions, for instance of the via opening 131V, may not be compatible with the corresponding manufacturing sequence. Thus, the via opening 131V may be formed on the basis of a corresponding lithographically defined etch mask, which may subsequently be removed and a corresponding further etch mask may be formed by lithography to define the position and lateral size of the trench openings 131T. In a subsequent etch process, the trench openings 131T may be formed in the upper portion of the dielectric material 131, while also the via opening 131V may be opened so as to extend to the corresponding metal lines 112. Thereafter, any resist material may be removed and the finally obtained surface may be subjected to appropriate cleaning processes, depending on the overall process strategy. As previously explained, during the preceding complex patterning process, the material 131 is exposed to reactive atmospheres, which may result in a certain degree of damage, thereby creating a damaged surface layer 132, which may also be present on inner surface areas of the trench openings 131T and the via openings 131V. Due to the significantly different material characteristics of the damaged surface layer 132, severe reliability problems may occur during the further processing and the operation of the device 100. Consequently, the damaged surface layer 132 may be removed by an appropriate etch recipe, which may typically be based on any appropriate acids or other agents, such as HCl and the like.

FIG. 1b schematically illustrates the semiconductor device 100 during a corresponding isotropic etch process 102, for instance on the basis of HCl, in order to remove the layer 132. Depending on the overall process strategy, a thickness of the layer 132 may range from 1-10 nm, and hence the process parameters, such as etch time and the like, during the process 102 may be selected so as to substantially completely remove the layer 132, even if the thickness of the layer 132 may vary depending on the overall device topography. Consequently, the dimensions of the openings 131T, 131V may be increased according to the thickness of the layer 132 and the parameters of the etch process 102, thereby resulting in an increase of the corresponding "critical" dimensions. Consequently, the further processing may have to be performed on the basis of increased critical dimensions, since a corresponding increase may not be taken into consideration when applying the corresponding patterning sequence for forming the openings 131T, 131V, due to the limitations with respect to lithography and associated etch techniques. Consequently, the increase of the critical dimensions may have to be taken into consideration in the basic device design of the device 100, which may result in a less pronounced performance gain when continuously shrinking critical dimensions of semiconductor devices. On the other hand, continuing the processing of the device 100 on the basis of the minimum critical dimensions, i.e., without removing the damaged layer 132, may result in an unacceptable increase of yield losses.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to techniques and semiconductor devices in which enhanced integrity of metal features in sensitive dielectric materials may be accomplished while substantially maintaining a desired critical dimension or while even reducing the critical dimensions according to a desired target value, which may be less compared to a target value used for patterning the sensitive dielectric material on the basis of lithography and etch techniques. For this purpose, a dielectric material of well-controllable material composition and thickness may be deposited on exposed surface portions of an opening formed in a sensitive dielectric material, such as a low-k material or a ULK material, wherein a high degree of selectivity may be achieved with respect to other surface areas, such as exposed surface areas of a metal region of a lower lying device level. Due to the enhanced controllability with respect to material composition and layer thickness, enhanced integrity of the sensitive dielectric material in combination with a metal feature to be formed in the opening may be accomplished, for instance by appropriately designing the overall desired characteristics with respect to adhesion and the like, so that improved compatibility with a metal-containing material and the sensitive dielectric material may be obtained. Furthermore, in other illustrative aspects disclosed herein, the additional dielectric material may re-establish a desired critical dimension or may even be used for adjusting a desired reduced critical dimension, depending on the overall process strategy. In some illustrative aspects disclosed herein, the deposition of the dielectric material may be accomplished on the basis of a self-limiting deposition technique, such as atomic layer deposition (ALD) in which a plurality of deposition cycles may be performed, each of which may exhibit a self-limiting behavior. Consequently, if required, each deposition cycle may be performed on the basis of an appropriately selected precursor material so that the overall material characteristics may be adjusted on the basis of individual deposition cycles.

One illustrative method disclosed herein comprises forming an opening in a low-k dielectric material, wherein the opening extends to a metal region formed in a metallization layer of a semiconductor device. The method further comprises passivating an exposed surface portion of the metal region and forming a dielectric material on inner sidewall surfaces of the opening by performing a self-limiting deposition process while using the passivated surface portion as a deposition hindering material.

A further illustrative method disclosed herein comprises treating a low-k dielectric material of a semiconductor device so as to create a hydrophilic surface, wherein the low-k dielectric material comprises an opening extending to a contact area. The method further comprises treating a surface portion of the contact area that is exposed by the opening so as to become hydrophobic. Finally, the method comprises selectively depositing a dielectric material on the hydrophilic surface.

One illustrative semiconductor device disclosed herein comprises a low-k dielectric material formed above a substrate and a metal-containing region formed in the low-k dielectric material. Furthermore, the semiconductor device comprises an interface layer formed between the low-k dielectric material and the metal-containing region, wherein the interface layer comprises a dielectric material having a first material composition at a first surface that is in contact with the low-k dielectric material and further has a second material composition at a second surface that is in contact with the metal-containing region. Moreover, the first and second material compositions are different.

BRIEF DESCRIPTION OF THE DRAWINGS

The disclosure may be understood by reference to the following description taken in conjunction with the accompanying drawings, in which like reference numerals identify like elements, and in which:

FIGS. 2d-2g represent enlarged views of a portion of the semiconductor device shown in FIGS. 2a-2c during a self-limiting deposition process, according to illustrative embodiments;

Figure 1A:
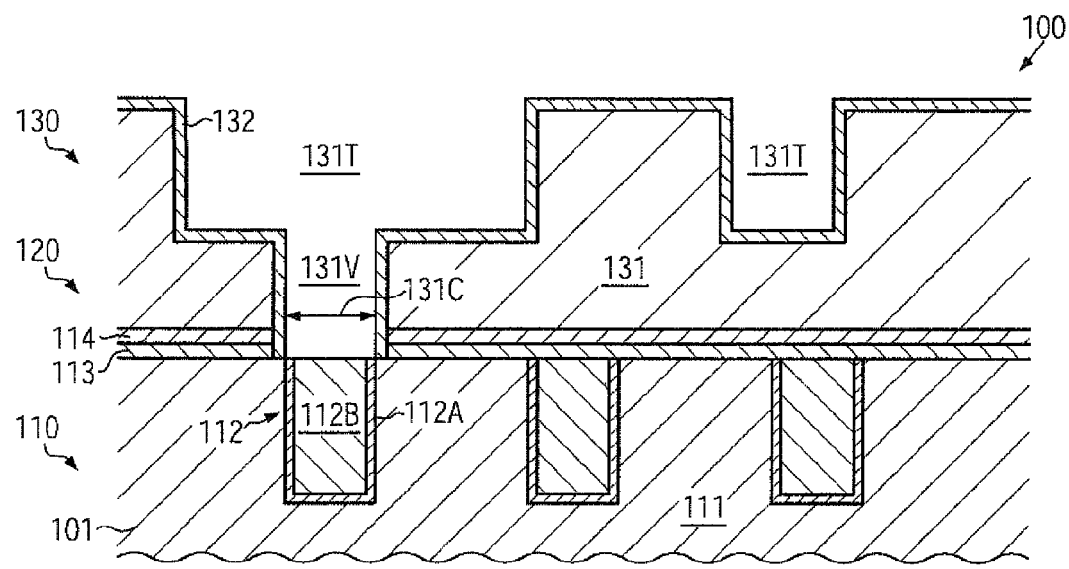
FIGS. 1a-1b schematically illustrate cross-sectional views of an advanced semiconductor device during various manufacturing stages in forming a metallization system on the basis of conventional strategies.
Figure 1B:
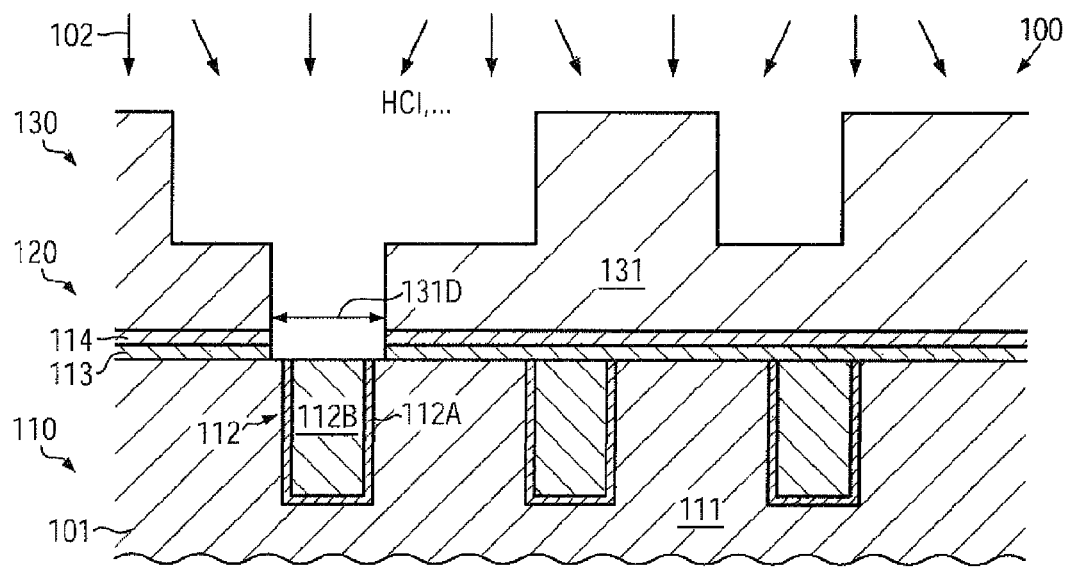

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure relates to techniques and semiconductor devices in which the removal of a damaged sensitive dielectric surface layer during the patterning of low-k dielectric materials may be compensated for or even over-compensated for by forming an "interfacing" dielectric material in a highly controllable manner, thereby enabling a further device scaling for given capabilities of a lithography process and etch process while also providing the possibility of using dielectric materials of even reduced dielectric constant in view of further enhancing overall device performance. For this purpose, in some illustrative embodiments, the deposition of the additional dielectric material may be accomplished in a highly selective manner by appropriately treating other exposed surface areas, such as an exposed surface of a metal region, so as to obtain a hydrophobic characteristic which may provide a high degree of selectivity during a subsequent deposition process in which material may preferably be deposited on hydrophilic surface areas of the low-k dielectric material. Consequently, well-established removal techniques, for instance based on HCl and the like, may be used for removing the damaged surface portions of the low-k dielectric material, thereby providing the desired hydrophilic surface characteristics so that a high degree of compatibility with conventional process strategies may be maintained. On the other hand, the hydrophobic surface portions may substantially not take part in an appropriately designed deposition cycle so that a desired material composition and/or layer thickness for the additional dielectric material may be selected substantially without affecting the hydrophobic surface areas. Moreover, due to the high degree of controllability of the deposition process, the material characteristics may be varied during the growth of the additional dielectric material in order to provide enhanced overall integrity. For example, portions of the additional dielectric material may be provided with a desired low dielectric constant, while other areas, for instance surface areas connecting to a metal region, may receive an appropriate surface to enhance overall adhesion, thereby improving the reliability of the resulting metal feature. By appropriately designing the interface characteristics with respect to the metal feature, a high degree of flexibility may be achieved, for instance in view of selecting different barrier materials, so that the additional dielectric material may act as an appropriate interface layer that may allow the usage of different materials at both sides of the interface layer. In some illustrative aspects disclosed herein, the additional dielectric material may include appropriate components that may be sensitive with respect to radiation, such as UV light, in order to enhance the cross-linking of the dielectric material, which may provide an efficient mechanism for enhancing overall integrity of a complex metallization system based on sensitive dielectric materials.

It should be appreciated that the principles disclosed herein may be advantageously applied to advanced metallization systems, since, in this context, the gain in performance of semiconductor devices may be very pronounced by the usage of dielectric materials of even reduced relative permittivity in combination with reduced critical dimensions. Consequently, in this situation, the development of corresponding "scaled" lithography and etch techniques may be postponed, since the damaged surface layers, which may increase in proportion with a further reduction of the critical dimensions, and/or the advance to dielectric materials of further reduced relative permittivity may compensate for the restricted capabilities of these lithography and etch techniques. However, the principles disclosed herein may also be applied to less critical metallization systems and also to other device levels in which sensitive dielectric materials may have to be formed on the basis of restricted lithography and etch capabilities. Thus, the present disclosure should not be considered as being restricted to the formation of metallization systems unless such restrictions are explicitly set forth in the appended claims or corresponding embodiments described in the specification.

Figure 2A:
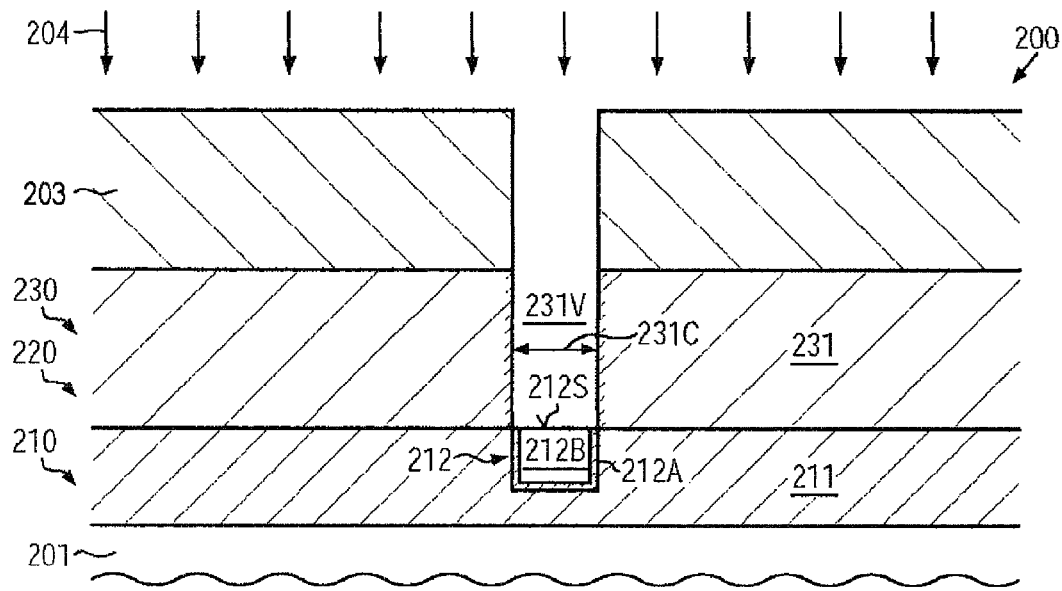
FIGS. 2a-2c schematically illustrate cross-sectional views of a semiconductor device during various manufacturing stages in forming an opening in a sensitive dielectric material, according to illustrative embodiments.

FIG. 2a schematically illustrates a cross-sectional view of a semiconductor device 200 in a manufacturing stage in which a sensitive dielectric material has to be patterned to receive an opening, which may be filled with a metal-containing material. In the embodiment shown, the semiconductor device 200 may comprise a substrate 201 which may represent any appropriate carrier material for forming thereon and therein circuit elements, such as transistors, capacitors and the like, which, for convenience, are not shown in FIG. 2a. For example, in some illustrative embodiments, the substrate 201 may have formed thereabove a semiconductor layer in and above which may be provided transistor elements having critical dimensions of 50 nm and less, which may thus also require appropriately designed metal features in a metallization system 220. The metallization system 220 may comprise a metallization layer 230 in which an appropriate metal feature, such as a via, a metal line and the like, is to be formed. In the embodiment shown, the metallization layer 230 may comprise a dielectric material 231, which may comprise any appropriate dielectric material, such as a low-k dielectric material having a desired low permittivity, as is also previously explained. It should be appreciated that the dielectric material 231 may be comprised of different layers of material, depending on the overall process and device requirements. Furthermore, in the embodiment shown, the metallization system 220 may further comprise a metallization layer 210 comprising an appropriate dielectric material 211 in which may be embedded a metal region 212. For example, the metal region 212 may comprise a conductive barrier material 212A in combination with a highly conductive metal 212B, such as copper and the like. In other illustrative embodiments, the region 212 may represent any contact region of a circuit element, such as a drain or source area, a gate electrode terminal and the like, to which an electrical connection via the metallization layer 230 is to be established. Furthermore, an opening 231V may be formed in the dielectric material 231 so as to extend to the metal region 212, thereby exposing a surface portion 212S thereof. Furthermore, an etch mask 203 may be formed above the dielectric material 231, possibly in combination with any other appropriate materials, such as ARC materials and the like, as may be required for patterning the dielectric material 231.

The semiconductor device 200 may be formed on the basis of process techniques as are also described with reference to the semiconductor device 100. It should be appreciated that the opening 231V may represent any desired opening, such as a via opening, a trench and the like, while, in other cases, an additional trench may be formed in the dielectric material 231 to connect to the opening 231V according to well-established dual damascene strategies. Thus, the present disclosure should not be restricted to any specific process flow for patterning the dielectric material 231, unless such restrictions are explicitly set forth in the appended claims.

The metallization layer 210 may be formed, for instance, on the basis of similar process techniques as may also be applied when patterning the metallization layer 230, as will be explained later on in more detail. Consequently, the dielectric material 231 may be provided by any appropriate deposition technique to obtain the desired material characteristics. In some illustrative embodiments, the material 231 may comprise silicon in combination with other components, such as hydrogen, oxygen and the like. For example, a plurality of low-k dielectric materials based on these species are well known in the art. For instance, a material composition including silicon, carbon, oxygen and hydrogen may be used wherein the dielectric constant may be adjusted, for instance, based on the degree of porosity, the deposition conditions and the like. Generally, a reduced density of the material may provide a reduced dielectric constant. Thereafter, the etch mask 203 may be formed and an etch process 204 may be performed to etch through the material 231, wherein other material layers, such as etch stop materials and the like, may be etched afterwards to finally expose the surface portion 212S. As previously explained, the capabilities of the etch process 204 and the lithography process used for providing the etch mask 203 may result in a certain minimum critical dimension 231C, which may represent the minimum critical dimension required for the further processing of the device 200, while, in other cases, an even reduced critical dimension may be required when highly sophisticated semiconductor devices are considered, in which the present available abilities of the lithography process and/or the etch process 204 may not allow a further reduced critical dimension 231C.

Figure 2B:
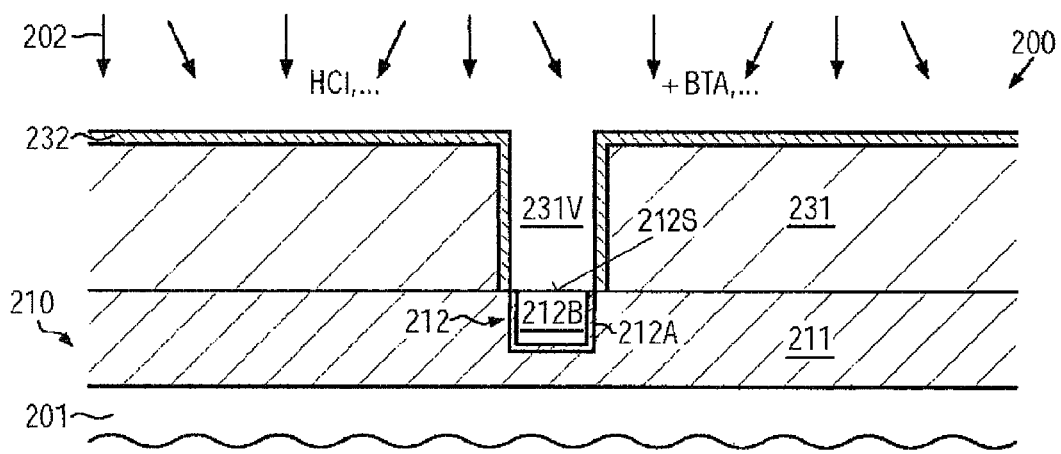

FIG. 2b schematically illustrates the semiconductor device 200 in a further advanced manufacturing stage after the removal of the etch mask 203. As previously explained, exposure of the dielectric material 231 to the various reactive ambients, such as a plasma ambient for removing etch masks and resist material and the like, may result in a certain degree of damage, which may depend on the characteristics of the preceding etch processes and the characteristics of the material 231. Typically, a lower dielectric constant may result in an increased thickness of a damaged material layer 232. Thus, the layer 232 may be removed, which may be accomplished on the basis of well-established process techniques, such as using any appropriate chemistry in the form of HCl and the like. Thus, during the etch process 202, the layer 232 may be removed while, in some illustrative embodiments, the etch chemistry of the process 202 may be appropriately selected so as to also passivate the exposed surface portion 212S with respect to a deposition process to be performed in a later manufacturing stage. For example, appropriate passivating materials with respect to copper material are well known in the art and may be used for this purpose. For instance, triazole, or any derivatives thereof, such as BTA (benzene triazole) and the like, may be used in combination with the reactive agent, such as HCl. In other cases, any other appropriate sulphur-containing agent may be used, as long as a desired passivation of the exposed surface 212S may be accomplished. In some illustrative embodiments, the passivation of the exposed surface portion 212S may be accomplished by creating a hydrophobic surface characteristic at the portion 212S based on the chemical reaction of the passivating agent during the etch process 202. In other illustrative embodiments, the process of passivating the exposed surface portion 212S may be performed as a separate step, for instance prior to or after the removal of the damaged surface layer 232.

Figure 2C:
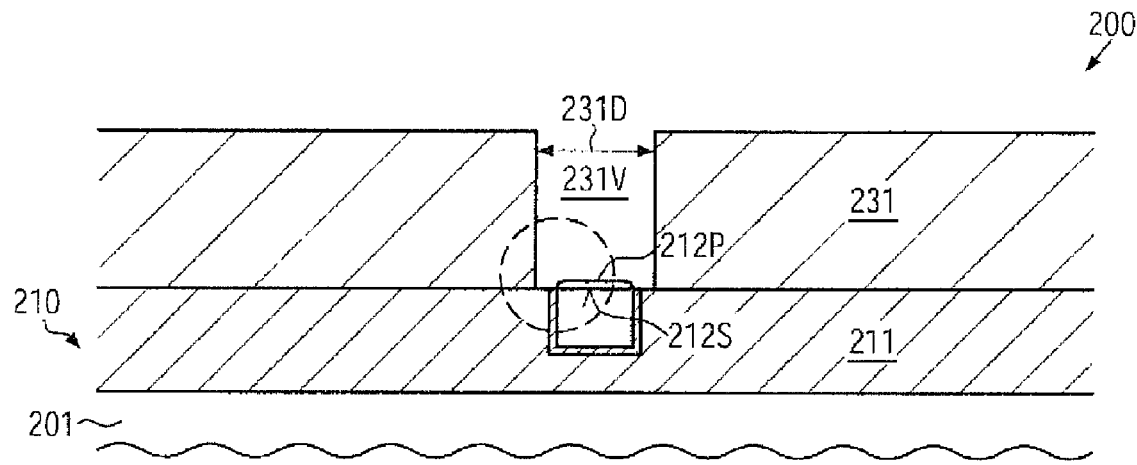

FIG. 2c schematically illustrates the device 200 after the removal of the layer 232 and with a passivation layer 212P formed on the surface portion 212S. Consequently, the opening 231V may have an increased lateral dimension, as indicated by 231D.

Figure 2D:
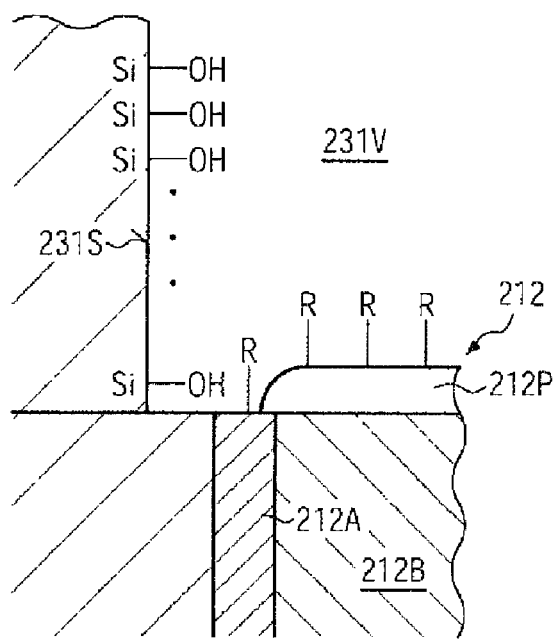

FIG. 2d schematically illustrates an enlarged view of a portion of the device 200 as indicated by the circle in FIG. 2c. As illustrated, the passivation layer 212P may have a hydrophobic surface, as indicated by corresponding surface bonds "R," which may substantially not take part in a chemical reaction during a subsequent deposition process. On the other hand, the silicon species at a surface 231S within the opening 231V, and also at other exposed surface portions of the dielectric material 231, may have a hydrophilic character due to the preceding treatment 202 (FIG. 2b). Consequently, respective hydroxyl groups may be available for a surface reaction for a subsequent deposition process.

FIG. 2e schematically illustrates the semiconductor device during a deposition process 205, which, in some illustrative embodiments, may represent a self-limiting deposition process in which a plurality of deposition cycles may be performed in order to obtain a plurality of surface layers of well-defined thickness and material composition. In the embodiment shown, a precursor gas 205A may be introduced, which may react with the OH groups of the hydrophilic surface areas, while the passivation layer 212P may substantially not take part in the chemical reaction. For example, the molecules of the precursor material 205A may include Cl bonds with a central silicon atom and may also have functional groups Y1 and Y2, which may be selected so as to adjust the overall characteristics of the dielectric material to be deposited. For example, the Y1, Y2 groups may be selected to appropriately modify the finally obtained film characteristic, for instance by using cage molecules to produce a highly porous dielectric material with a well-defined core diameter given by the geometry of the molecules Y1 and/or Y2. In other cases, simpler molecules may be used, for instance at specific phases of the deposition process 205 to provide a more densified material while also an adaptation to other materials may be accomplished that may be filled into the opening 231V in a later manufacturing stage. For example, at a final phase of the deposition process 205, any appropriate material, such as nitrogen and the like, may be incorporated into the precursor species 205A to enhance adhesion to a barrier material, such as tantalum nitride and the like. Moreover, in some illustrative embodiments, UV combustible organic molecules may be used for one or both of the Y1 or Y2 molecules, thereby enabling a UV induced cross-linking of the dielectric material deposited during the process 205.

For instance, during the introduction of the precursor material 205A, one of the chlorine bonds may react with a corresponding OH group, thereby releasing HCl and forming a surface layer, the density of which may be adjusted on the basis of the temperature during the deposition process 205. For instance, a temperature of approximately 20-300° C. may be used.

FIG. 2f schematically illustrates the semiconductor device 200 after a first deposition step of the process 205. Thus, a first layer 233A may be formed on the exposed hydrophilic surface area, the material characteristics of which may be substantially determined by the groups Y1 and Y2, as discussed above.

FIG. 2g schematically illustrates the device 200 during a further step of the deposition process 205. As illustrated, the device may be purged with water, thereby activating the remaining chlorine bond of the layer 233A so that a further OH group may be available for a further deposition cycle. Consequently, depending on the desired material composition and thickness of the dielectric material, the respective number of deposition and purge cycles may be used.

Figure 2H:
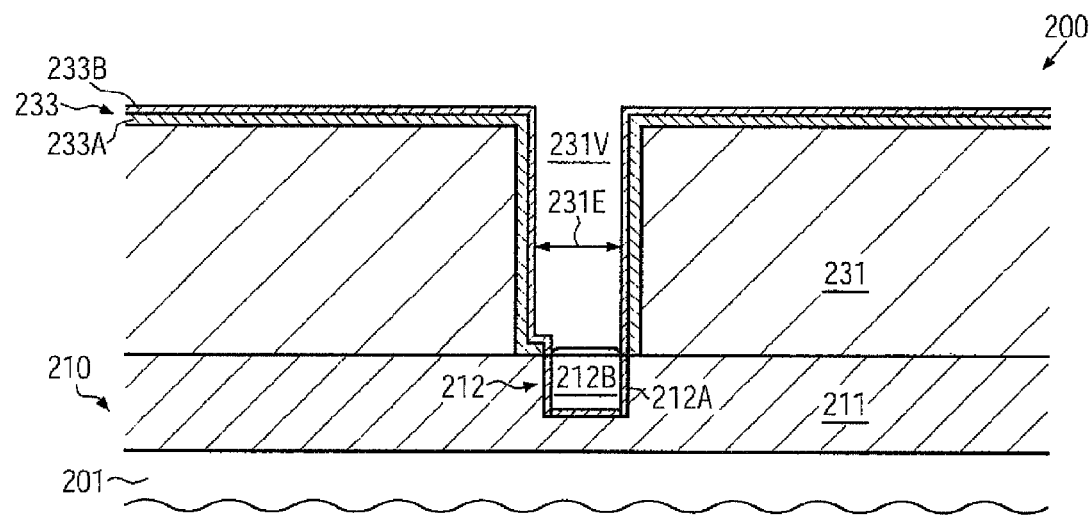
FIGS. 2h-2i schematically illustrate the semiconductor device during further advanced manufacturing stages in forming a metal feature in a sensitive dielectric material, according to further illustrative embodiments.

FIG. 2h schematically illustrates the semiconductor device 200 after completing the deposition process 205. As illustrated, a dielectric material layer 233 may be formed to have a desired thickness in order to obtain the desired critical dimension 231E which may be selected in accordance with overall device requirements. For example, the critical dimension 231E may be approximately equal to the critical dimension 231C (FIG. 2a) or may even be less, as previously explained. Furthermore, in the embodiment shown, the dielectric material layer 233 may comprise the layer 233A and at least one further layer 233B having a different material composition compared to the layer 233A. For example, the material compositions of the layers 233A, 233B may be selected such that an appropriate interface may be provided to connect to the material 231 on the one side and to connect to a metal-containing material to be filled into the opening 231V in a later manufacturing stage. It should be appreciated, however, that a plurality of different material compositions may be used by appropriately selecting one or both of the molecules Y1, Y2 as discussed above. Thereafter, the further processing may be continued on the basis of well-established process techniques. That is, a barrier material may be deposited and subsequently the opening 231V may be filled with an appropriate metal, such as copper, which may be accomplished on the basis of electrochemical deposition techniques.

Figure 2I:
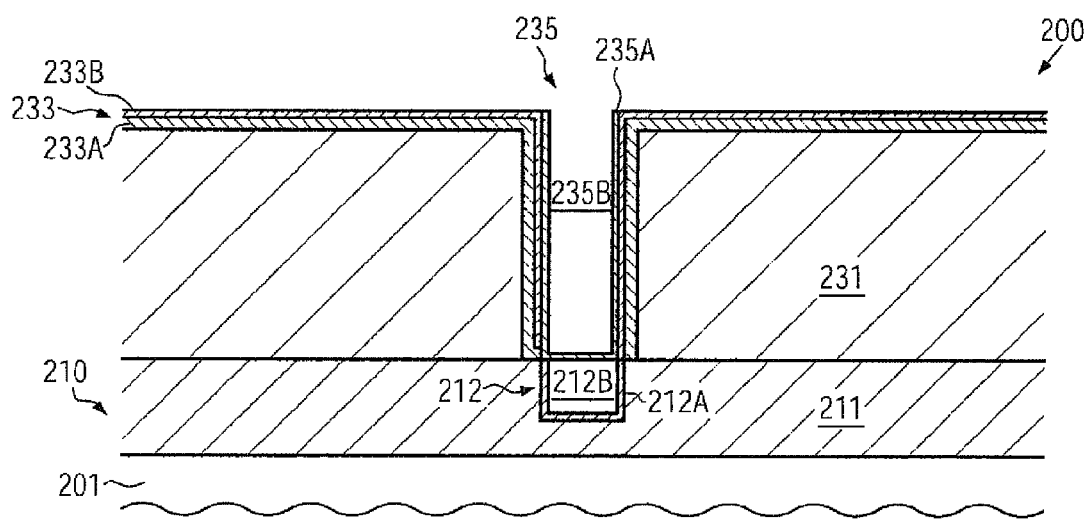

FIG. 2i schematically illustrates the semiconductor device 200 in a further advanced manufacturing stage in which a metal region 235, for instance in the form of a via, a trench and the like, may be provided and may comprise a conductive barrier material 235A and a highly conductive metal 235B. Moreover, the dielectric material layer 233 may provide the desired interface characteristic between the metal region 235 and the dielectric material 231. For example, by providing a moderately dense material in the layer 233B, enhanced integrity of the metal feature 235 may be accomplished, for instance with respect to the further processing and preceding processes, such as the chemical mechanical polishing (CMP), as may typically be used for removing any excess material when filling in the conductive barrier material 235A and the metal 235B. Furthermore, enhanced adhesion to the barrier material 235A may be provided by appropriately adapting the characteristics of at least the layer 233B.

Figure 2J:
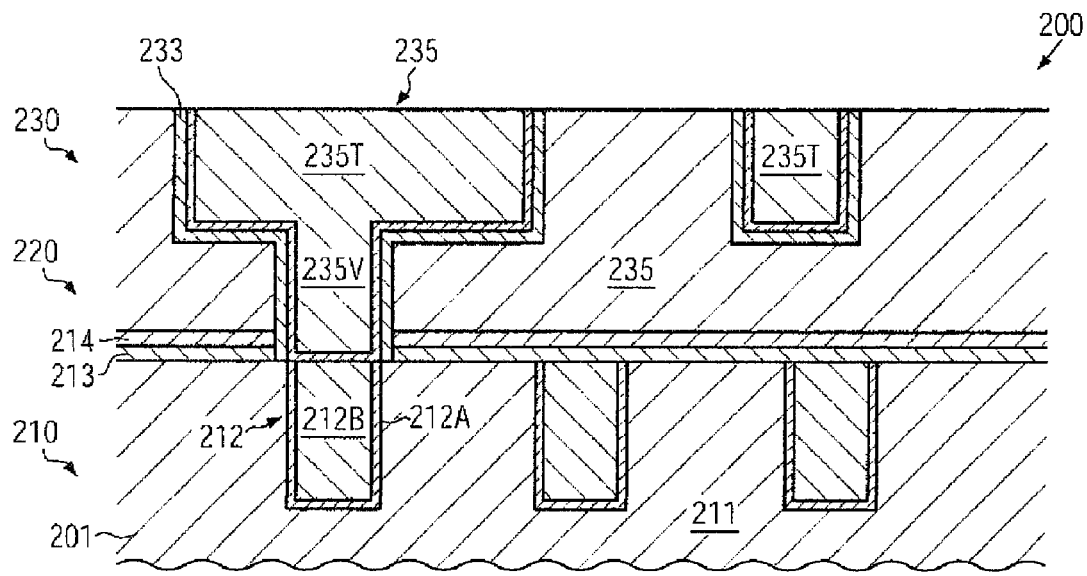
FIG. 2j schematically illustrates a cross-sectional view of a complex metallization system of the semiconductor device in which a dielectric material may be selectively deposited by a cyclic deposition technique, according to still other illustrative embodiments.

FIG. 2j schematically illustrates the semiconductor device 200 according to further illustrative embodiments in which the metallization layer 230 may be formed in accordance with a dual damascene strategy, as is also described with reference to the device 100. Consequently, the metallization layer 230 may comprise at least some of the metal regions 235 in the form of metal lines 235T in combination with a via 235V connecting to a respective metal region 212 provided in the metallization layer 210. Furthermore, respective dielectric materials 213 and 214 may be provided, if required, as is also previously discussed with reference to the layers 113 and 114. With respect to the manufacturing sequence for forming the semiconductor device 200 as shown in FIG. 2j, the same criteria apply as discussed with reference to the device 100 in combination with the device 200, as described above, when forming the dielectric material layer 233 and also when adjusting the thickness and the material composition thereof.

Figure 2K:
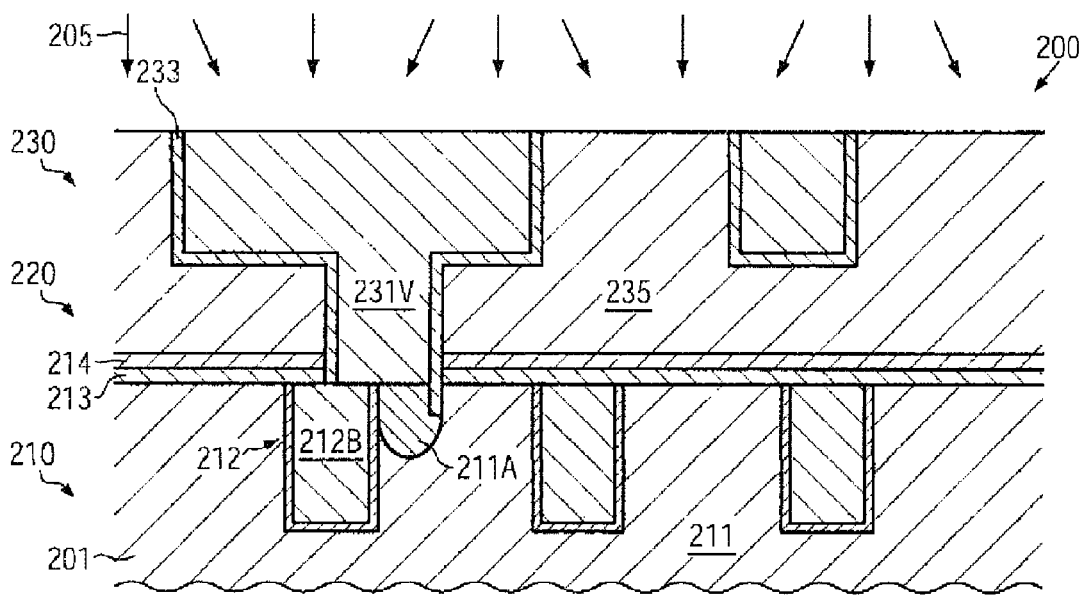
FIG. 2k schematically illustrates the semiconductor device during a manufacturing sequence for forming metal features wherein defects caused by non-perfect alignment accuracy may be filled on the basis of a dielectric material during a recovery adjustment of critical dimensions, according to still further illustrative embodiments.

FIG. 2k schematically illustrates the semiconductor device 200 in a manufacturing stage when performing the deposition process 205. As illustrated, during the previous manufacturing flow, a certain degree of misalignment may have occurred during forming the via opening 231V so that the corresponding etch processes may result in a significant removal of material of the layer 211. Hence, a respective void 211A may be created which may, according to conventional process techniques, represent a severe reliability issue during the further processing of the device 200. However, during the deposition process 205, material of the layer 233 may also be deposited within the void 211A, thereby at least reducing the size thereof, thereby providing enhanced condition during the subsequent manufacturing flow, for instance for forming the conductive barrier material and the highly conductive metal.

As a result, this disclosure provides methods and semiconductor devices in which integrity of sophisticated device structures including sensitive dielectric materials may be enhanced and/or critical dimensions may be adjusted on the basis of a selective deposition process, which may provide a high degree of controllability with respect to material composition and thickness. Consequently, well-established lithography and etch techniques may be used, in combination with further reduced overall device dimensions and dielectric materials with reduced permittivity, since respective damaged portions may be efficiently replaced by an appropriate material, the thickness and composition of which may be precisely controlled.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming an opening in a low-k dielectric material, said opening extending to a metal region formed in a metallization layer of a semiconductor device;
   passivating an exposed surface portion of said metal region; and
   forming a dielectric material layer on inner sidewall surfaces of said opening by performing a self-limiting deposition process.

2. The method of claim 1, wherein passivating said exposed surface portion comprises treating said exposed surface portion so as to adopt a hydrophobic surface characteristic.

3. The method of claim 2, wherein treating said exposed surface portion comprises exposing said surface portion to a passivation ambient including sulphur.

4. The method of claim 3, wherein said passivation ambient is established on the basis of a chemistry comprising at least one of triazole and a derivative thereof.

5. The method of claim 1, wherein forming said opening comprises using an etch chemistry reacting with said low-k dielectric material so as to create a hydrophilic surface characteristic.

6. The method of claim 1, wherein forming said dielectric material comprises controlling said self-limiting deposition process to adjust a critical dimension of said opening according to a predefined final target width that is less than an initial target width used for forming said opening.

7. The method of claim 1, wherein at least a first precursor material and a second precursor material that differs from said first precursor material are used during at least two deposition cycles of said self-limiting deposition process.

8. The method of claim 7, wherein said first precursor material is selected so as to form a porous portion in said dielectric material layer.

9. The method of claim 8, wherein said second precursor material is selected so as to form an adhesion layer that provides enhanced adhesion for a conductive barrier material.

10. The method of claim 1, further comprising forming a conductive barrier material on said dielectric material layer and filling said opening with a metal.

11. The method of claim 1, wherein said low-k dielectric material comprises silicon and wherein said self-limiting deposition process is performed on the basis of a silicon-containing precursor material.

12. The method of claim 1, wherein forming said opening comprises performing a first etch process to etch through said low-k dielectric material and to expose said portion of the metal region and performing a second etch process to remove a damaged layer portion of said low-k dielectric material.

13. The method of claim 1, wherein said opening represents a trench opening and a via opening connected to said trench opening.

14. A method, comprising:
   treating a low-k dielectric material of a semiconductor device so as to create a hydrophilic surface, said low-k dielectric material comprising an opening extending to a contact area;
   treating a surface portion of said contact area that is exposed by said opening so as to become hydrophobic; and
   selectively depositing a dielectric material on said hydrophilic surface.

15. The method of claim 14, wherein selectively depositing said dielectric material comprises performing a cyclic deposition process using a precursor material adhering to said hydrophilic surface.

16. The method of claim 15, wherein at least two different precursor materials are used during said cyclic deposition process.

17. The method of claim 14, wherein treating said low-k dielectric material comprises removing material of said low-k dielectric material by performing an isotropic etch process using an etch chemistry that creates said hydrophilic surface.

18. The method of claim 14, wherein treating said surface portion of said contact area comprises applying a sulphur containing chemistry to said surface portion.

19. The method of claim 17, wherein a thickness of said dielectric material layer is equal to or greater than a thickness of said material removed by said isotropic etch process.

20. The method of claim 14, further comprising forming a conductive barrier material on said dielectric material layer and filling said opening with a metal.

* * * * *